US012812773B2

(12) United States Patent
Johnson

(10) Patent No.: US 12,812,773 B2
(45) Date of Patent: Nov. 24, 2026

(54) FLEXIBLE PRINTED CIRCUIT CABLE

(71) Applicant: Microsoft Technology Licensing, LLC, Redmond, WA (US)

(72) Inventor: Kajsa Ava Johnson, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 262 days.

(21) Appl. No.: 18/651,485

(22) Filed: Apr. 30, 2024

(65) Prior Publication Data

US 2025/0338395 A1 Oct. 30, 2025

(51) Int. Cl.
*H05K 1/02* (2006.01)
*H05K 3/46* (2006.01)

(52) U.S. Cl.
CPC ........... *H05K 1/028* (2013.01); *H05K 1/0222* (2013.01); *H05K 3/46* (2013.01); *H05K 2201/055* (2013.01); *H05K 2201/09236* (2013.01); *H05K 2201/093* (2013.01)

(58) Field of Classification Search
None
See application file for complete search history.

(56) References Cited

U.S. PATENT DOCUMENTS 3,589,004 A * 6/1971 Shaheem ............... H05K 1/118 439/55
5,059,143 A * 10/1991 Grabbe .................. H01R 13/22 439/840
5,383,788 A * 1/1995 Spencer ................. H05K 1/118 439/493
5,841,414 A * 11/1998 Tanaka ................. G09G 3/3611 345/206
5,877,940 A * 3/1999 Millette ............... H05K 3/4691 174/254
5,978,210 A * 11/1999 McCrary ............... G06F 1/1616 174/89
6,055,722 A * 5/2000 Tighe ................... H05K 9/0039 29/842

(Continued)

FOREIGN PATENT DOCUMENTS

CN 107819177 A 3/2018
CN 117082725 A * 11/2023 ........... H05K 1/0298

(Continued)

OTHER PUBLICATIONS

Original and Translation of CN107819177 (Year: 2018).*

(Continued)

*Primary Examiner* — Timothy J. Dole
*Assistant Examiner* — Muhammed Azam
(74) *Attorney, Agent, or Firm* — Alleman Hall LLP

(57) ABSTRACT

An FPC cable is provided that includes a first ground trace on a first side of an insulator substrate and a second ground trace on the first side of the insulator substrate spaced from the first ground trace. A plurality of signal lines are located between the first ground trace and the second ground trace. A ground reference layer is located on a second side of the insulator substrate, with the ground reference layer comprising a plurality of ground reference layer segments spaced from one another. Each of the ground reference layer segments is connected with a via to the first ground trace and the second ground trace.

20 Claims, 7 Drawing Sheets

(56) References Cited

U.S. PATENT DOCUMENTS

| | | | | |
|---|---|---|---|---|
| 6,225,568 | B1 * | 5/2001 | Lin | H05K 1/0224 174/250 |
| 6,953,898 | B2 * | 10/2005 | Chen | B41J 19/20 174/99 R |
| 7,410,381 | B2 * | 8/2008 | Tang | H01R 12/716 439/260 |
| 7,756,556 | B2 * | 7/2010 | Patel | H01H 23/16 343/700 R |
| 7,947,910 | B2 * | 5/2011 | Hsu | H05K 1/0228 174/262 |
| 8,273,990 | B2 * | 9/2012 | Lin | H05K 1/028 174/117 FF |
| 8,692,125 | B2 * | 4/2014 | Kato | H05K 1/09 174/254 |
| 8,758,028 | B2 * | 6/2014 | Muro | H05K 3/4691 439/67 |
| 8,969,737 | B2 * | 3/2015 | Just | H05K 1/0218 361/818 |
| 9,185,802 | B2 * | 11/2015 | Matsuda | H05K 3/36 |
| 9,374,886 | B2 * | 6/2016 | Kato | H05K 1/0218 |
| 9,750,132 | B2 * | 8/2017 | Kato | H05K 1/028 |
| 9,872,379 | B2 * | 1/2018 | Codd | H05K 1/0233 |
| 9,872,390 | B1 * | 1/2018 | Holbery | H05K 1/0283 |
| 10,225,934 | B2 * | 3/2019 | Kegeler | H01F 3/10 |
| 10,651,617 | B1 * | 5/2020 | Saito | H05K 1/147 |
| 10,700,459 | B1 * | 6/2020 | Farkas | H01R 12/79 |
| 10,973,116 | B2 * | 4/2021 | Kong | H05K 1/0222 |
| 11,134,563 | B2 * | 9/2021 | Noguchi | H01R 12/62 |
| 12,101,873 | B2 * | 9/2024 | Lee | H05K 1/0216 |
| 12,176,642 | B2 * | 12/2024 | Sane | H01R 12/592 |
| 12,213,245 | B2 * | 1/2025 | Wu | H05K 1/028 |
| 12,216,498 | B2 * | 2/2025 | Gu | H05K 1/18 |
| 12,376,228 | B2 * | 7/2025 | Hodges | H05K 1/0292 |
| 12,408,264 | B2 * | 9/2025 | Chen | H05K 1/0245 |
| 12,490,374 | B2 * | 12/2025 | Seo | H04M 1/0268 |
| 12,537,890 | B2 * | 1/2026 | Bae | H04M 1/0216 |
| 2002/0153611 | A1 * | 10/2002 | Nakanishi | H05K 1/0253 257/774 |
| 2002/0157865 | A1 * | 10/2002 | Noda | H05K 1/0224 174/261 |
| 2008/0070645 | A1 * | 3/2008 | Hsieh | H05K 1/148 439/63 |
| 2008/0078573 | A1 * | 4/2008 | Hu | H05K 1/0219 174/262 |
| 2008/0144295 | A1 * | 6/2008 | Wang | H05K 1/028 361/750 |
| 2013/0271942 | A1 * | 10/2013 | Kim | H05K 1/0218 361/816 |
| 2014/0354900 | A1 * | 12/2014 | Qian | H05K 1/028 174/254 |
| 2015/0049275 | A1 * | 2/2015 | Posner | G02F 1/1368 361/679.28 |
| 2015/0170794 | A1 * | 6/2015 | Mutnury | H01B 7/04 174/105 R |
| 2017/0093059 | A1 * | 3/2017 | Chen | H05K 1/147 |
| 2017/0273171 | A1 * | 9/2017 | Codd | H04N 25/617 |
| 2017/0295642 | A1 * | 10/2017 | Codd | H05K 1/14 |
| 2018/0350748 | A1 * | 12/2018 | Cheah | H05K 1/0253 |
| 2019/0082529 | A1 * | 3/2019 | Sloey | H05K 1/181 |
| 2019/0097357 | A1 * | 3/2019 | Mongold | H01R 13/514 |
| 2019/0150269 | A1 * | 5/2019 | Klenk | B62D 5/0403 310/68 R |
| 2020/0092982 | A1 * | 3/2020 | Defigueiredo | H05K 3/4644 |
| 2020/0170113 | A1 * | 5/2020 | Sreerama | H05K 1/147 |
| 2020/0183465 | A1 * | 6/2020 | Yoo | H01Q 1/2258 |
| 2020/0344871 | A1 * | 10/2020 | Momose | H04N 23/50 |
| 2021/0119350 | A1 * | 4/2021 | Zegarra | H01Q 21/28 |
| 2022/0232704 | A1 | 7/2022 | Woo | |
| 2023/0119129 | A1 | 4/2023 | Lee | |
| 2024/0381541 | A1 * | 11/2024 | Harrigan | H05K 3/341 |
| 2025/0338395 | A1 * | 10/2025 | Johnson | H01P 3/085 |
| 2026/0173258 | A1 * | 6/2026 | Wang | H05K 1/028 |

FOREIGN PATENT DOCUMENTS

| | | | | |
|---|---|---|---|---|
| DE | 19819088 A1 | * | 11/1999 | H02B 1/202 |
| JP | H0636620 A | * | 2/1994 | |

OTHER PUBLICATIONS

Original and Translation of KR20150055820 (Year: 2015).*
Extended European search report received for European Application No. 25173458.8, mailed on Sep. 26, 2025, 09 pages.

* cited by examiner

FLEXIBLE PRINTED CIRCUIT CABLE

BACKGROUND

Flexible printed circuit (FPC) cables are used as electrical connectors in various electronic devices.

SUMMARY

According to one aspect of the present disclosure, an FPC cable is provided comprising a first ground trace on a first side of an insulator substrate and a second ground trace on the first side of the insulator substrate spaced from the first ground trace. A plurality of signal lines are located between the first ground trace and the second ground trace. A ground reference layer is located on a second side of the insulator substrate, with the ground reference layer comprising a plurality of ground reference layer segments spaced from one another. Each of the ground reference layer segments is connected through the insulator substrate with a via to the first ground trace and the second ground trace.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

FPC cables can be manufactured using photolithography or other techniques to provide an electronic circuit that can be flexed to achieve non-planar shapes. The ability of these cables to flex offers advantages over rigid electrical connectors, such as space savings, installation ease, and ability to route around other components.

In some examples, FPC cables include a low-impedance reference plane in the form of a ground plane located on a layer separated from the signal trace(s) by a layer of dielectric material. Such ground planes provide a clear and uninterrupted loop for current flow to thereby improve signal integrity, minimize noise, and provide electromagnetic shielding to the FPC cable.

Conventional FPC cables that include one or more ground planes typically incur damage and fail reliability testing when the cable is flexed and/or bent. In one prior approach to address this issue, the ground plane is removed from the area in these cables where bending is desired. However, the absence of a ground plane in these areas creates a variety of electrical issues and risks, including but not limited to signal integrity, signal quality, and electromagnetic interference (EMI) problems. For example, many wireless communication enabled devices such as laptop computers, tablet computers, mobile phones, routers, etc., include one or more FPC cables. In such electronic devices that include a wireless radio, the absence of a ground plane in an FPC section can cause RF antennas of the radio to pick up unwanted radiofrequency (RF) emissions from the FPC cable. Such emissions interfere with signal reception and cause RF desensitization of the wireless radio, thereby limiting the radio range of the device. In some devices, the gap where no reference plane is provided creates a loop antenna that picks up unwanted noise and creates potential immunity problems. The foregoing issues can be especially pronounced for FPC cables carrying high frequency signals.

With reference now to FIGS. 1-14 and as described in more detail below, examples of FPC cables that address one or more of the issues discussed above will now be provided. For ease of illustration, the scale of the components of the FPC cables described herein is exaggerated in some aspects. The FPC cables described herein can also include one or more common features and/or components that are not illustrated in the examples discussed below. For example, FPC cables of the present disclosure can include one or more coverlays or coverfilms that encapsulate and protect the conductive traces and prevent short circuits. In different examples, FPC cables of the present disclosure can be utilized to electrically connect various electronic components of an electronic device.

Figure 1:
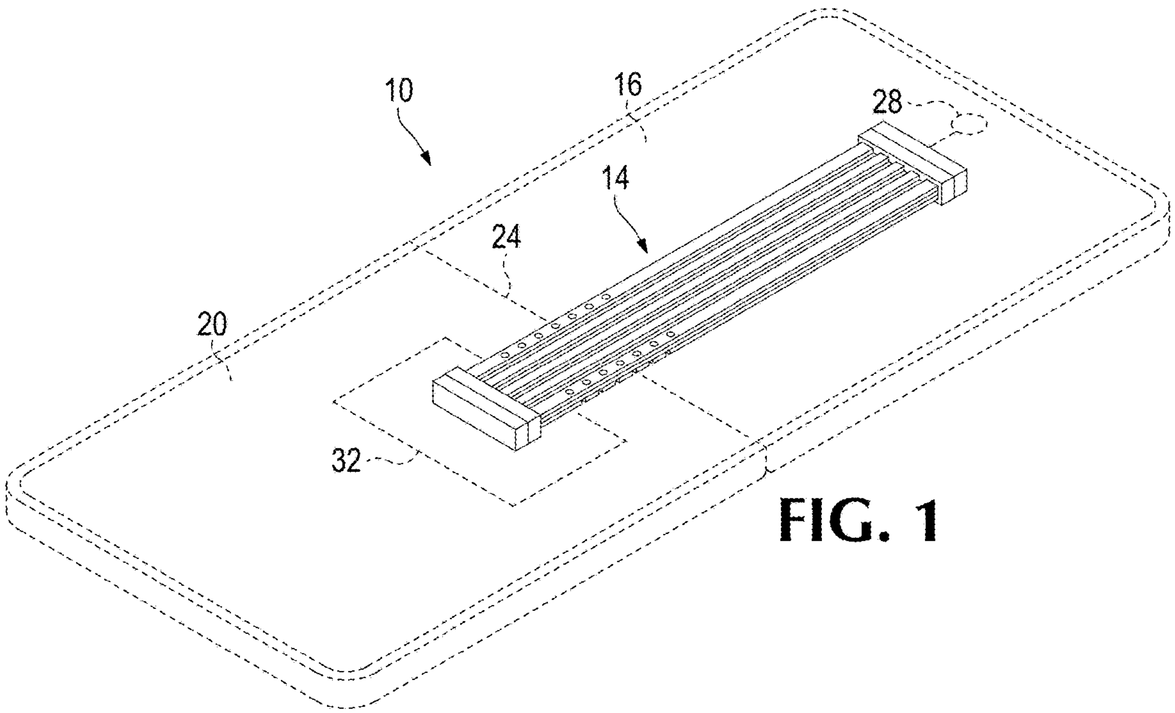
FIG. 1 shows a schematic perspective view of an example electronic device including an FPC cable according to an example of the present disclosure.

In one example, FIG. 1 shows a schematic illustration of an electronic device in the form of a foldable smart phone 10 that includes an FPC cable 14 according to aspects of the present disclosure. In other examples, FPC cables of the present disclosure can be utilized in a wide variety of contexts and with other electronic devices and related components. Examples include but are not limited to laptops, tablets, game devices, wearable devices, user input devices, and any other device, machine, or component utilizing an FPC.

In the present example the smart phone 10 includes a first section 16 foldably connected to a second section 20 at a hinge 24. As described further below, the first section 16 and second section 20 are configured to fold about the hinge 24, thereby also folding the FPC cable 14. In this example, the FPC cable 14 electrically connects a first electronic component in the form of camera 28 mounted in the first section 16 to a second electronic component in the form of a motherboard 32 located in the second section 20.

Figure 2:
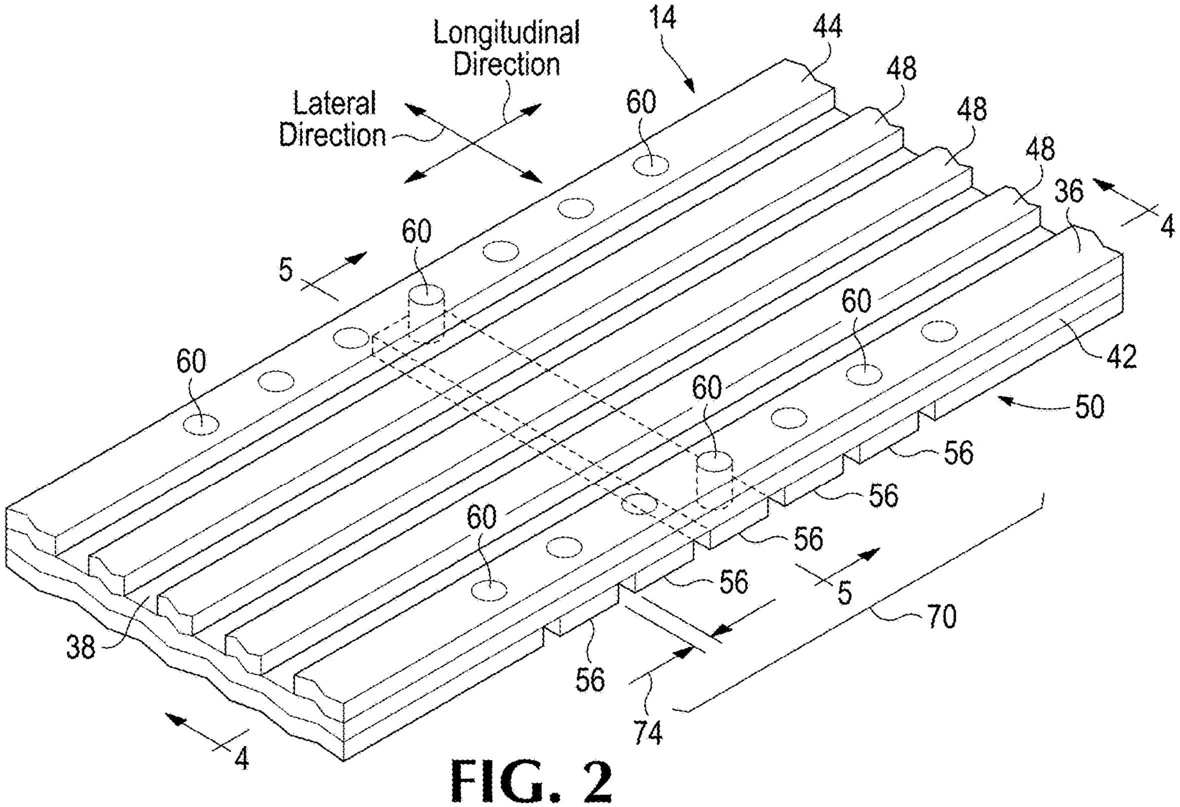
FIG. 2 shows an enlarged view of a portion of the FPC cable of FIG. 1.
Figure 3:
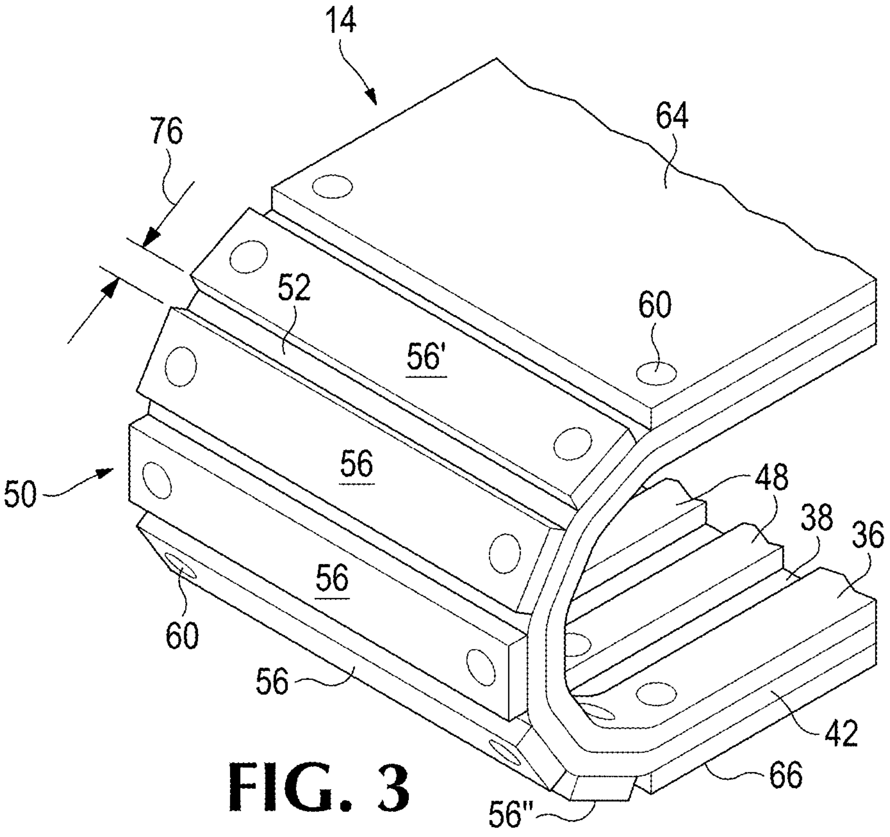
FIG. 3 shows an enlarged view of the FPC cable of FIG. 2 in a curved configuration.

FIGS. 2 and 3 show enlarged perspective views of a portion of the FPC cable 14 that spans across the hinge 24 of the smart phone 10. As noted above and for ease of illustration and description, the scale of the components of the FPC cable 14 is exaggerated in some aspects. In this example and with reference also to the cross-section views of FIGS. 4 and 5, the FPC cable 14 comprises a first ground trace 36 on a first side 38 of an insulator substrate 42 and a second ground trace 44 on the first side of the insulator substrate spaced in a lateral direction from the first ground trace. In this example three signal lines 48 are located on the first side 38 of the insulator substrate 42 between the first ground trace 36 and the second ground trace 44. In other examples of FPC cables according to the present disclosure, fewer or more signal lines 48 can be utilized.

FPC cable 14 also includes a ground reference layer 50 on a second side 52 of the insulator substrate 42 opposite to the first side 38. As described further below, the ground reference layer 50 comprises a plurality of ground reference layer segments 56 spaced from one another, wherein each of the ground reference layer segments is connected with a via 60 to the first ground trace 36 and the second ground trace 44. In one potential advantage of the present disclosure and as described further below, the ground reference layer segments 56 advantageously provide benefits of a ground plane, such as improved signal integrity, signal quality, and EMI protection, while also enabling bending of the FPC cable 14 without generating damaging forces within the ground reference layer 50.

Additionally, in the present example and as noted above, each ground reference layer segment 56 is connected to the first ground trace 36 and the second ground trace 44 with vias 60. In one potential advantage of this configuration, utilizing two vias 60 to electrically couple each ground reference layer segment 56 to separate ground traces provides more robust signal integrity, signal quality, and EMI protection as compared to a single via coupled to a single ground trace. In the present example the FPC cable 14 includes five ground reference layer segments 56. In other examples, any suitable number of ground reference layer segments can be utilized.

Figure 4:
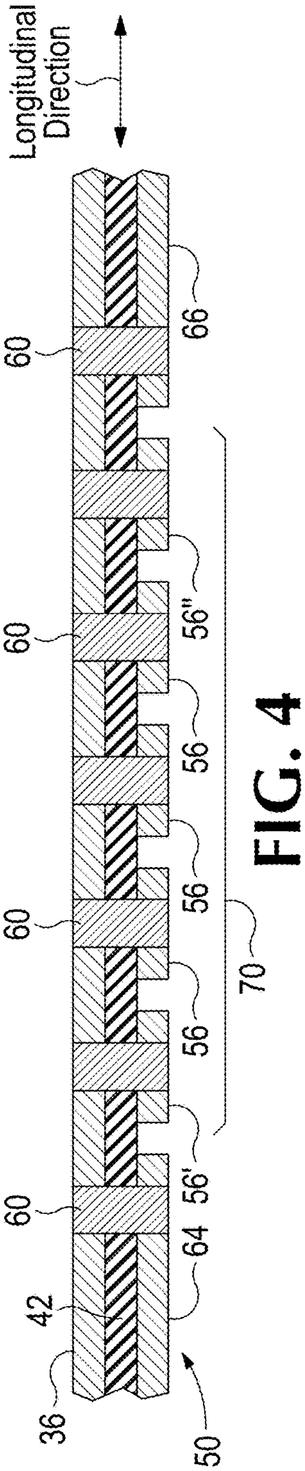
FIG. 4 shows a cross-section view of the FPC cable taken along line 4-4 in a longitudinal direction in FIG. 2.
Figure 5:
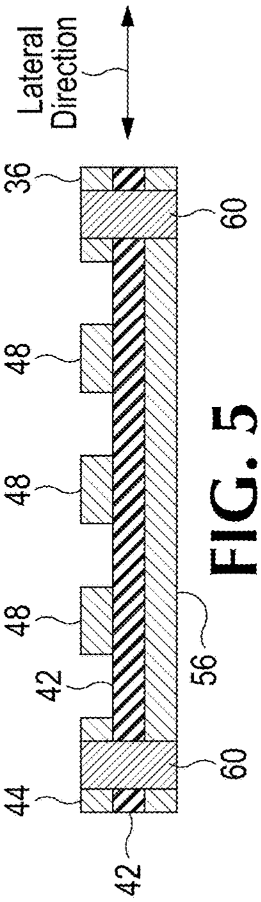
FIG. 5 shows a cross-section view of the FPC cable taken along line 5-5 in a lateral direction in FIG. 2.

With reference to FIGS. 2-4, in the present example the ground reference layer 50 comprises a first planar ground reference surface 64 extending longitudinally from a first endmost ground reference layer segment 56', and a second planar ground reference 66 surface extending longitudinally from a second endmost ground reference layer segment 56" opposite to the first endmost ground reference layer segment. In one potential advantage of the present disclosures, the plurality of ground reference layer segments 56 substantially define a bending region 70 of the FPC cable 14. More particularly, by spacing each of the ground reference layer segments 56 from one another and from the first planar ground reference surface 64 and the second planar ground reference 66, the bending region 70 of the FPC cable 14 can bend in both a first direction as shown in FIG. 3 and in the opposite direction in which the ground reference layer segments are located on the interior of the bending region.

With reference now to FIG. 2, in this example when the bending region 70 is substantially coplanar, the ground reference layer segments 56 are spaced from one another by a first gap 74. As shown in FIG. 3, when the bending region 70 is curved in a first direction, the ground reference layer segments 56 are spaced from one another by a second gap 76 greater than the first gap 74. In a similar manner, when the bending region 70 is curved in a second direction opposite to the first direction, the ground reference layer segments 56 are spaced from one another by a third gap that is smaller than the first gap. Advantageously and as noted above, this configuration enables the bending region 70 to bend in both a first direction as shown in FIG. 3 and in the opposite direction where the ground reference layer segments are located on the interior of the bending region. In different examples, this flexibility enables the FPC cable 14 to be routed along a curving path. Further, in electronic devices with portions that fold or move relative to one another, such flexibility allows the FPC cable 14 and bending region 70 to withstand frequent flexing and unflexing movements over the life of the device, thereby providing robust reliability and extended duty cycles of operation.

Additionally and as noted above, the ground reference layer segments 56 advantageously provide electrical benefits of a ground plane within the bending region 70, such as improved signal integrity, signal quality, and EMI protection. In some examples, the spacing between adjacent ground reference layer segments 56 can be selected to provide desired ground plane benefits in the context of a highest frequency signal carried by the signal lines 48. In one example, when the bending region 70 and ground reference layer segments 56 are substantially coplanar (see FIGS. 2 and 4), each of the ground reference layer segments 56 are spaced from one another by a gap 74 equal to or less than approximately 1/50th of the wavelength of the highest frequency signal carried by the signal lines 48. For example, where the highest frequency signal carried by the signal lines 48 is a 500 MHz signal, the ground reference layer segments 56 can be spaced from one another by a gap 74 equal to or less than approximately 12 mm. In such an example, the ground reference layer segments 56 can provide electrical benefits of a ground plane within the bending region 70 as discussed above. Further, in this configuration ground reference layer segments 56 can also provide electromagnetic shielding to the signal lines 48.

In some examples, a closer spacing between adjacent ground reference layer segments 56 can be utilized to provide more substantial electrical benefits associated with a ground plane. In one example, when the bending region 70 and ground reference layer segments 56 are substantially coplanar, each of the ground reference layer segments 56 are spaced from one another by a gap 74 equal to or less than approximately $1/100^{th}$ of the wavelength of the highest frequency signal carried by the signal lines 48. For example, where the highest frequency signal carried by the signal lines 48 is a 2 GHz signal, the ground reference layer segments 56 can be spaced from one another by a gap 74 equal to or less than approximately 3 mm. In such an example, the ground reference layer segments 56 can provide more robust electrical benefits of a ground plane within the bending region 70 as discussed above.

Figure 6:
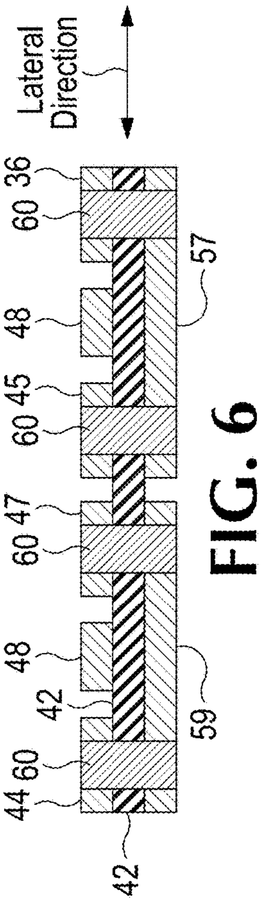
FIG. 6 shows a cross-section view in a lateral direction of another example of an FPC cable according to the present disclosure.

With reference now to FIG. 6, another example configuration of an FPC cable according to the present disclosure is illustrated. In this example and like the example of FIGS. 1-5 described above, the ground reference layer comprises a plurality of ground reference layer segments spaced from one another. In this example, each ground reference layer segment comprises a first sub-segment 57 and a second sub-segment 59 that is spaced from the first sub-segment in the lateral direction and is substantially colinear with the first sub-segment. The first sub-segment 57 is connected to first ground trace 36 and to a third ground trace 45 with two vias 60. Similarly, second sub-segment 59 is connected to second ground trace 44 and to a fourth ground trace 47 with two vias 60. In this example, one signal line 48 is located between each pair of ground traces. In other examples, two or more signal lines 48 can be located between each pair of ground traces. In one potential advantage of this configuration, by dividing each ground reference layer segment into two shorter sub-segments laterally spaced from one another, the FPC cable can be afforded a greater degree of flexibility to be curved in the longitudinal direction.

Figure 7:
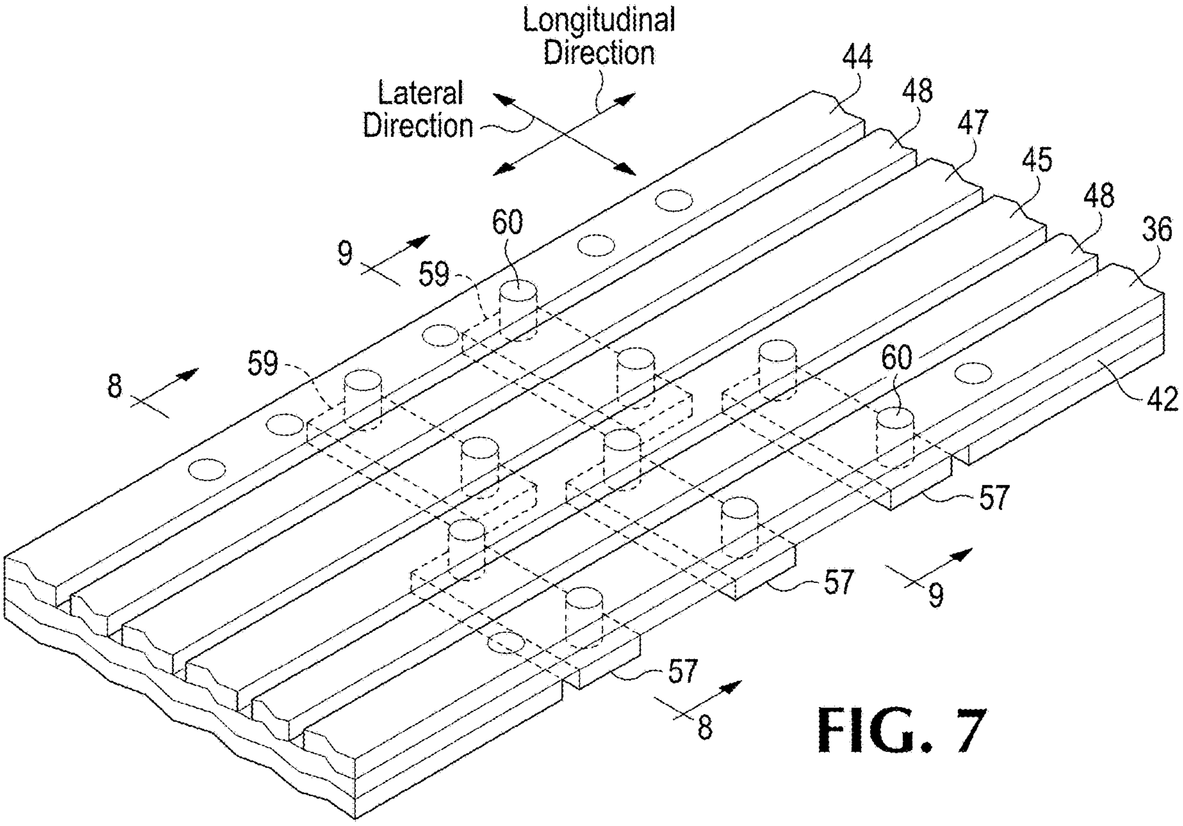
FIG. 7 shows partial perspective view of another example of an FPC cable according to the present disclosure.
Figure 8:
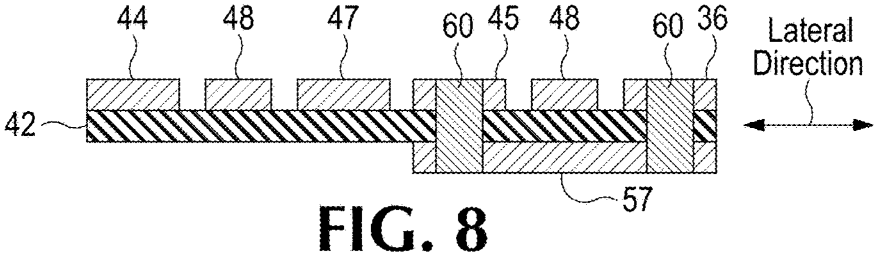
FIG. 8 shows a cross-section view of the FPC cable of FIG. 7 taken along line 8-8 in a lateral direction.
Figure 9:
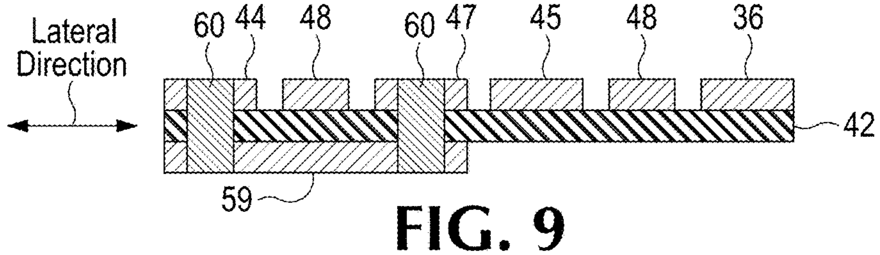
FIG. 9 shows a cross-section view of the FPC cable of FIG. 7 taken along line 9-9 in a lateral direction.

With reference now to FIGS. 7-9, another example configuration of an FPC cable according to the present disclosure is illustrated. In this example a first sub-segment 57 of each ground reference layer segment is spaced from a second sub-segment 59 in a longitudinal direction along the FPC cable. As best seen in FIG. 7, this configuration creates an alternating, stair-stepping pattern of ground reference layer sub-segments extending in the longitudinal direction along the FPC cable. In some example use cases, this alternating pattern of first sub-segment 57 and second sub-segment 59 across the bending region of the FPC cable can provide more continuous protection in the longitudinal direction from electrical issues and risks, such as compromised signal integrity, signal quality, and/or electromagnetic interference (EMI) problems, while also enabling bending of the FPC cable 14 without generating potentially damaging forces within the ground reference layer.

Figure 10:
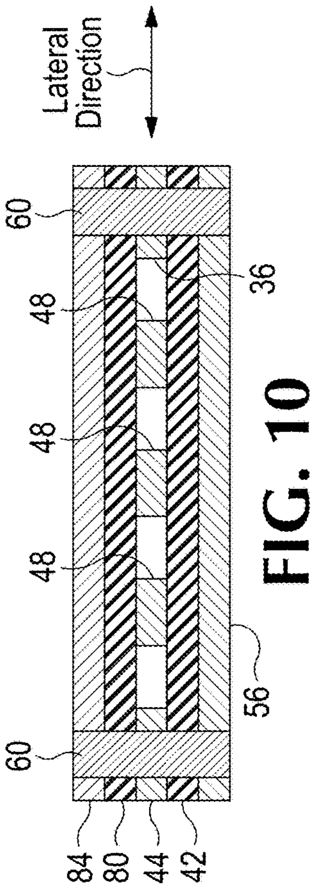
FIG. 10 shows a cross-section view in a lateral direction of another example of an FPC cable according to the present disclosure.
Figure 11:
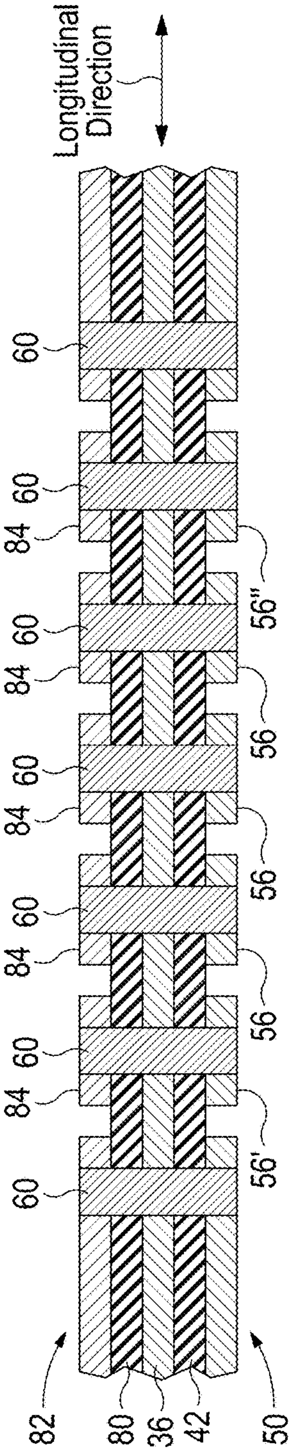
FIG. 11 shows a cross-section view of the FPC cable of FIG. 10 taken in a longitudinal direction through the first ground trace.

With reference now to FIGS. 10 and 11, another example configuration of an FPC cable according to the present disclosure is illustrated. In this example, signal lines 48 are enclosed by a second insulator substrate 80 located between first and second ground traces 36, 44 and a second ground reference layer 82 (see FIG. 11). Like the first ground reference layer described above, the second ground reference layer 82 comprises a plurality of second ground reference layer segments 84 spaced from one another in the longitudinal direction, wherein each of the second ground reference layer segments is connected through the first insulator substrate 42 and second insulator substrate 80 with a via 60 to the first ground trace 36 and the second ground trace 44. Additionally and as shown in FIG. 11, each of the second ground reference layer segments 84 is also connected with a via to a corresponding first ground reference layer segment 56 of the first ground reference layer 50. In one potential advantage of this configuration, the additions of second insulator substrate 80 and second ground reference layer 82 with second ground reference layer segments 84 provides additional EMI shielding to the other side of the signal lines 48 in the FPC cable, along with more robust signal integrity, signal quality, and EMI protections, while still facilitating bending of the FPC cable without generating potentially damaging forces within the ground reference layer.

Figure 12:
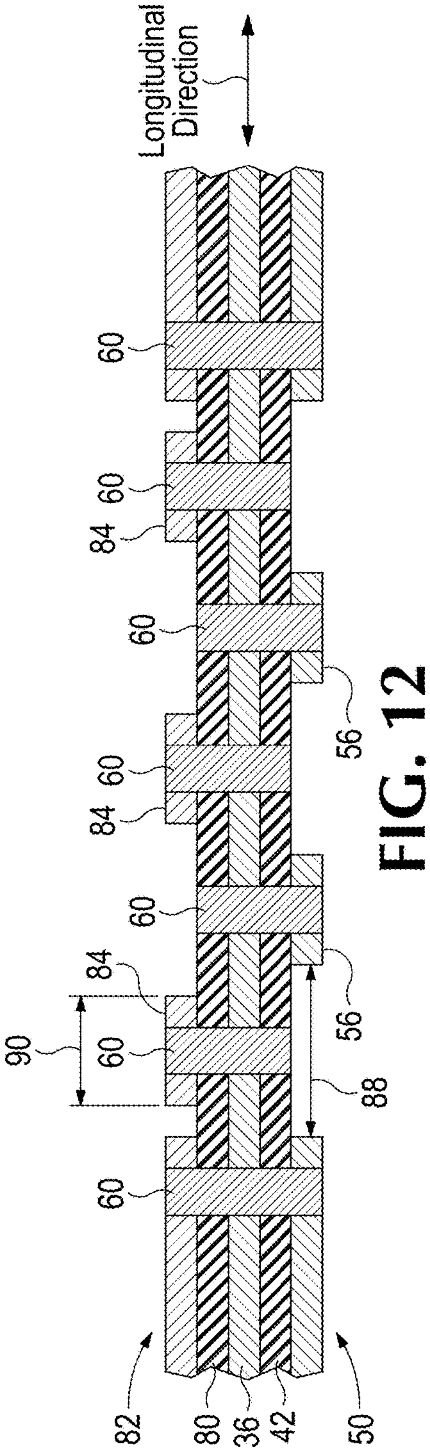
FIG. 12 shows a cross-section view taken in a longitudinal direction of another example of an FPC cable according to the present disclosure.

With reference now to FIG. 12, another example configuration of an FPC cable according to the present disclosure is illustrated. In this example, and in an alternative configuration of the example of FIG. 11, each of the first ground reference layer segments 56 is located in between two opposing second ground reference layer segments 84 in a longitudinal direction along a length of the FPC cable. In the present example, each of the first ground reference layer segments 56 is spaced from an adjacent first ground reference layer segment by a segment spacing distance 88 that is greater than a width 90 of each of the second ground reference layer segments 84. Similarly, each of the second ground reference layer segments 84 is spaced from an adjacent second ground reference layer segment by the segment spacing distance 88 that is greater than the width 90 of each of the first ground reference layer segments 56.

In one potential advantage of this configuration, by locating the second ground reference layer segments 84 between two opposing first ground reference layer segments 56 in a longitudinal direction, and providing greater spacing between adjacent first ground reference layer segments 56 and second ground reference layer segments 84, more liberal bending capacity of the FPC cable is enabled while also providing additional EMI shielding along with more robust signal integrity, signal quality, and EMI protections.

Figure 13:
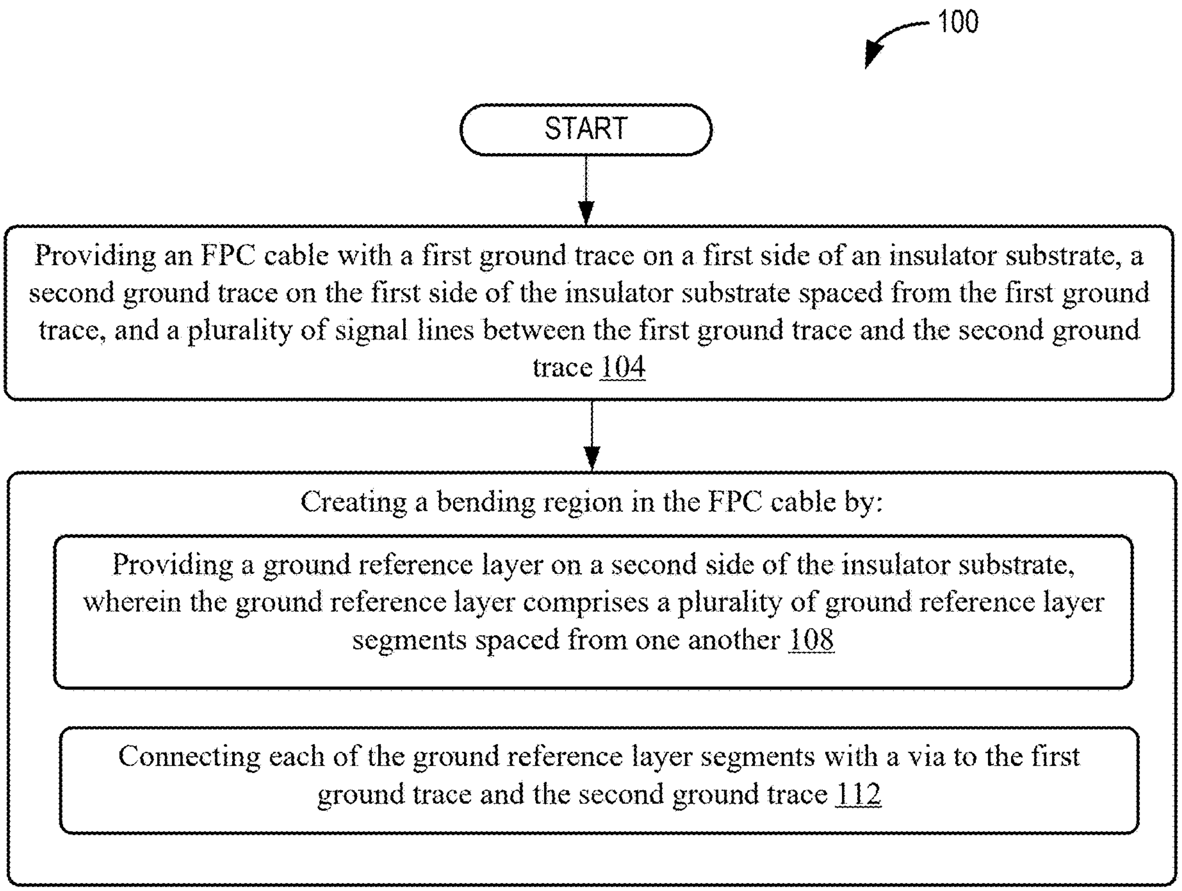
FIG. 13 shows a flow chart of a method of manufacturing a flexible FPC cable according to an example of the present disclosure.

With reference now to FIG. 13, an example method 100 of manufacturing a flexible printed circuit (FPC) cable will now be described. The following description of method 100 is provided with reference to the examples and components described herein and shown in FIGS. 1-12. It will be appreciated that following description of method 100 is provided by way of example and is not meant to be limiting. Therefore, it is to be understood that method 100 may include additional and/or alternative steps relative to those illustrated in FIG. 13. Further, it is to be understood that the steps of method 100 may be performed in any suitable order. Further still, it is to be understood that one or more steps may be omitted from method 100 without departing from the scope of this disclosure. It will also be appreciated that method 100 also may be performed in other contexts using other suitable components.

With reference to FIG. 13, at 104 the method 100 includes providing an FPC cable with a first ground trace on a first side of an insulator substrate, a second ground trace on the first side of the insulator substrate spaced from the first ground trace, and a plurality of signal lines between the first ground trace and the second ground trace. Method 100 includes creating a bending region in the FPC cable by, at 108, providing a ground reference layer on a second side of the insulator substrate, wherein the ground reference layer comprises a plurality of ground reference layer segments spaced from one another, and at 112 connecting each of the ground reference layer segments with a via to the first ground trace and the second ground trace.

The above-described FPC cables, electronic devices and method may be used to provide benefits of a ground plane, such as improved signal integrity, signal quality, and EMI protection, while also enabling bending of the FPC cable without generating damaging forces within the ground reference layer. In some examples, electromagnetic interference with wireless communications from wireless radio transceivers can be inhibited and RF desensitization can be avoided in electronic devices that communicate with wireless radio transceivers, such as laptop devices, smart phones and tablets, routers, desktop computers, and IoT devices. The flexibility of the FPC cables of the present disclosure allows spacing adjustments to accommodate sections where the FPC cable is bent by reducing the resistance to bending in the longitudinal direction of the FPC cable, which can be useful to traverse obstacles such as hinges within a housing of an electronic device.

Figure 14:
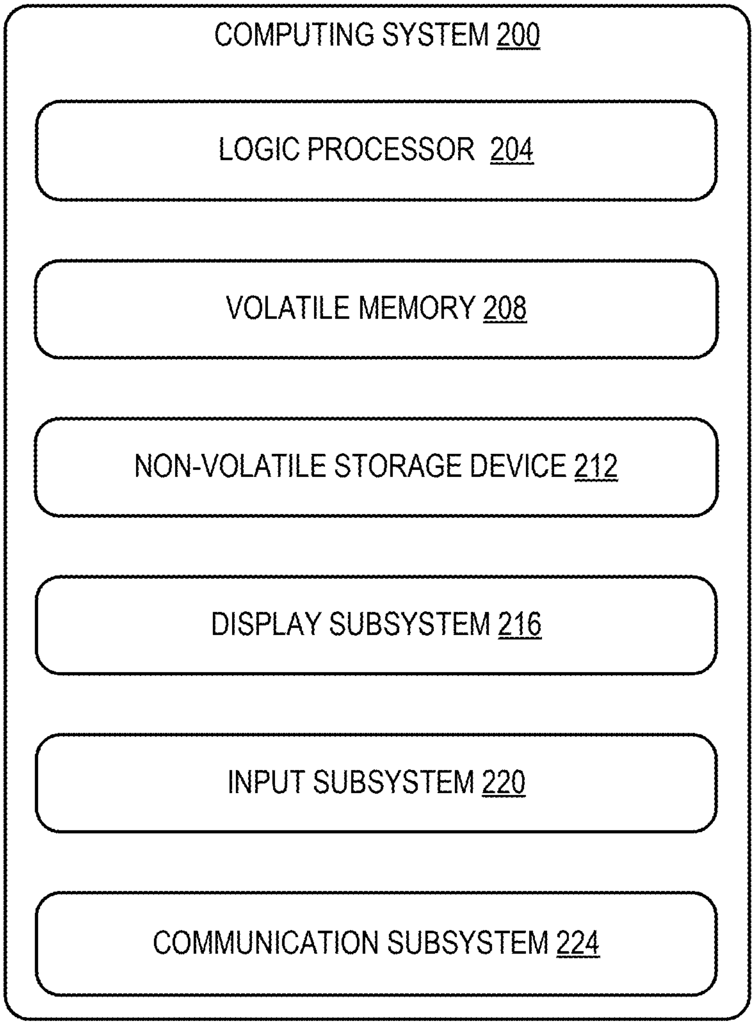
FIG. 14 shows a schematic view of an example computing architecture of the electronic device of FIG. 1 according to examples of the present disclosure.

FIG. 14 schematically shows a non-limiting embodiment of a computing system 200. Computing system 200 is shown in simplified form. Computing system 200 can embody the electronic device 10 described above. Computing system 200 may take the form of one or more personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices.

Computing system 200 includes a logic processor 204, volatile memory 208, and a non-volatile storage device 212. Computing system 200 may optionally include a display subsystem 216, input subsystem 220, communication subsystem 224, and/or other components not shown in FIG. 14. One or more printed circuit boards may be provided, to which the logic processor 204, volatile memory 208, and a non-volatile storage device 212 may be mounted. These components may communicate with each other via a communications bus. One or more FPC cables described above may connect these components to each other, as well.

Logic processor 204 includes one or more physical devices configured to execute instructions. For example, the logic processor may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic processor 204 may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 204 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 212 includes one or more physical devices configured to hold instructions executable by the logic processors to implement the methods and processes described herein. When such methods and processes are implemented, the state of non-volatile storage device 212 may be transformed—e.g., to hold different data.

Non-volatile storage device 212 may include physical devices that are removable and/or built-in. Non-volatile storage device 212 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 212 may include nonvolatile, dynamic, static, read/write, read-only, sequential-access, location-addressable, file-addressable, and/or content-addressable devices. It will be appreciated that non-volatile storage device 212 is configured to hold instructions even when power is cut to the non-volatile storage device 212.

Volatile memory 208 may include physical devices that include random access memory. Volatile memory 208 is typically utilized by logic processor 204 to temporarily store information during processing of software instructions. It will be appreciated that volatile memory 208 typically does not continue to store instructions when power is cut to the volatile memory 208.

Aspects of logic processor 204, volatile memory 208, and non-volatile storage device 212 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), microcontroller units (MCUs), and complex programmable logic devices (CPLDs), for example.

When included, display subsystem 216 may be used to present a visual representation of data held by non-volatile storage device 212. As the herein described methods and processes change the data held by the non-volatile storage device, and thus transform the state of the non-volatile storage device, the state of display subsystem 216 may likewise be transformed to visually represent changes in the underlying data. Display subsystem 216 may include one or more display devices utilizing virtually any type of technology. Such display devices may be combined with logic processor 204, volatile memory 208, and/or non-volatile storage device 212 in a shared enclosure, or such display devices may be peripheral display devices.

When included, input subsystem 220 may comprise or interface with one or more user-input devices such as a stylus, trackpad, keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 224 may be configured to communicatively couple various computing devices described herein with each other, and with other devices. Communication subsystem 224 may include wired and/or wireless communication devices compatible with one or more different communication protocols. As non-limiting examples, the communication subsystem 224 can include a wireless radio transceiver configured for communication via 4G, 5G, or LTE mobile data network connections, Wi-Fi connections, BLUETOOTH connections, or connections via other communications protocols. In some embodiments, the communication subsystem may allow computing system 200 to send and/or receive messages to and/or from other devices via a network such as the Internet.

This disclosure is presented by way of example and with reference to the associated drawing figures. Components, process steps, and other elements that may be substantially the same in one or more of the figures are identified coordinately and are described with minimal repetition. It will be noted, however, that elements identified coordinately may also differ to some degree. It will be further noted that some figures may be schematic and not drawn to scale. The various drawing scales, aspect ratios, and numbers of components shown in the figures may be purposely distorted to make certain features or relationships easier to see.

It will be appreciated that the terms "includes," "including," "has," "contains," variants thereof, and other similar words used in either the detailed description or the claims are intended to be inclusive in a manner similar to the term "comprising" as an open transition word without precluding any additional or other elements.

The following paragraphs provide additional support for the claims of the subject application. One aspect provides a flexible printed circuit (FPC) cable comprising: a first ground trace on a first side of an insulator substrate; a second ground trace on the first side of the insulator substrate spaced from the first ground trace; a plurality of signal lines between the first ground trace and the second ground trace; and a ground reference layer on a second side of the insulator substrate, the ground reference layer comprising a plurality of ground reference layer segments spaced from one another, wherein each of the ground reference layer segments is connected with a via to the first ground trace and the second ground trace. The FPC cable may additionally or alternatively include, wherein the plurality of ground reference layer segments substantially define a bending region of the FPC cable. The FPC cable may additionally or alternatively include, wherein when the bending region is substantially coplanar, the ground reference layer segments are spaced from one another by a first gap, and when the bending region is curved in a first direction, the ground reference layer segments are spaced from one another by a second gap greater than the first gap. The FPC cable may additionally or alternatively include, wherein when the bending region is curved in a second direction opposite to the first direction, the ground reference layer segments are spaced from one another by a third gap smaller than the first gap. The FPC cable may additionally or alternatively include, wherein when the bending region is substantially coplanar, the ground reference layer segments are spaced from one another by a gap equal to or less than approximately $1/50^{th}$ of a wavelength of a highest frequency signal carried by the plurality of signal lines. The FPC cable may additionally or alternatively include, wherein when the bending region is substantially coplanar, the ground reference layer segments are spaced from one another by a gap equal to or less than approximately $1/100^{th}$ of a wavelength of a highest frequency signal carried by the plurality of signal lines. The FPC cable may additionally or alternatively include, wherein when the bending region is substantially coplanar, the ground reference layer segments are spaced from one another by a gap equal to or less than approximately 12 mm. The FPC cable may additionally or alternatively include, wherein when the bending region is substantially coplanar, the ground reference layer segments are spaced from one another by a gap equal to or less than approximately 3 mm. The FPC cable may additionally or alternatively include, wherein the ground reference layer comprises a first planar ground reference surface extending longitudinally from a first endmost ground reference layer segment of the plurality of ground reference layer segments, and a second planar ground reference surface extending longitudinally from a second endmost ground reference layer segment opposite to the first endmost ground reference layer segment of the plurality of ground reference layer segments. The FPC cable may additionally or alternatively include, wherein each of the ground reference layer segments comprises a first sub-segment and a second sub-segment spaced from the first sub-segment. The FPC cable may additionally or alternatively include, wherein the first sub-segment is connected with a first via to the first ground trace and the second sub-segment is connected with a second via to the second ground trace. The FPC cable may additionally or alternatively include, wherein the FPC cable further comprises a third ground trace and a fourth ground trace on the first side of the insulator substrate, the first sub-segment is connected with a third via to the third ground trace, and the second sub-segment is connected with a fourth via to the fourth ground trace. The FPC cable may additionally or alternatively include, wherein the first sub-segment is substantially colinear with the second sub-segment. The FPC cable may additionally or alternatively include, wherein the first sub-segment is spaced from the second sub-segment in a longitudinal direction along the FPC. The FPC cable may additionally or alternatively include, wherein the insulator substrate is a first insulator substrate, the ground reference layer is a first ground reference layer, and the plurality of ground reference layer segments are a plurality of first ground reference layer segments, wherein the FPC further comprises a second insulator substrate between the first ground trace and a second ground reference layer, the second ground reference layer comprising a plurality of second ground reference layer segments spaced from one another, wherein each of the second ground reference layer segments is connected with a via to the first ground trace and the second ground trace. The FPC cable may additionally or alternatively include, wherein each of the second ground reference layer segments is also connected with the via to a corresponding first ground reference layer segment of the first ground reference layer. The FPC cable may additionally or alternatively include, wherein each of the first ground reference layer segments is located in between two opposing second ground reference layer segments in a longitudinal direction along a length of the FPC cable.

Another aspect provides an electronic device, comprising: a housing; a first electronic component in the housing; a second electronic component in the housing; and a flexible printed circuit (FPC) cable connecting the first electronic component and the second electronic component, the FPC cable comprising: a first ground trace on a first side of an insulator substrate; a second ground trace on the first side of the insulator substrate spaced from the first ground trace; a plurality of signal lines between the first ground trace and the second ground trace; and a ground reference layer on a second side of the insulator substrate, the ground reference layer comprising a plurality of ground reference layer segments spaced from one another, wherein each of the ground reference layer segments is connected with a via to the first ground trace and the second ground trace. The electronic device may additionally or alternatively include, wherein the plurality of ground reference layer segments substantially define a bending region of the FPC cable, wherein when the bending region is substantially coplanar, the ground reference layer segments are spaced from one another by a first gap, and when the bending region is curved, the ground reference layer segments are spaced from one another by a second gap greater than the first gap.

Another aspect provides a method of manufacturing a flexible printed circuit (FPC) cable, the method comprising: providing an FPC cable with a first ground trace on a first side of an insulator substrate, a second ground trace on the first side of the insulator substrate spaced from the first ground trace, and a plurality of signal lines between the first ground trace and the second ground trace; and creating a bending region in the FPC cable by: providing a ground reference layer on a second side of the insulator substrate, wherein the ground reference layer comprises a plurality of ground reference layer segments spaced from one another;

and connecting each of the ground reference layer segments with a via to the first ground trace and the second ground trace.

It will be understood that the configurations and/or approaches described herein are exemplary in nature, and that these specific embodiments or examples are not to be considered in a limiting sense, because numerous variations are possible. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A flexible printed circuit (FPC) cable comprising:

a first ground trace extending in a longitudinal direction on a first side of an insulator substrate;

a second ground trace extending in the longitudinal direction on the first side of the insulator substrate spaced from the first ground trace;

a plurality of signal lines between the first ground trace and the second ground trace; and a ground reference layer on a second side of the insulator substrate, the ground reference layer comprising a plurality of ground reference layer segments spaced from one another in the longitudinal direction, wherein each of the ground reference layer segments is connected with a via to the first ground trace and the second ground trace, wherein each of the ground reference layer segments comprises a first sub-segment and a second sub-segment spaced from the first sub-segment in a lateral direction and the longitudinal direction.

2. The FPC cable of claim 1, wherein the plurality of ground reference layer segments substantially define a bending region of the FPC cable.

3. The FPC cable of claim 2, wherein when the bending region is substantially coplanar, the ground reference layer segments are spaced from one another by a first gap, and when the bending region is curved in a first direction, the ground reference layer segments are spaced from one another by a second gap greater than the first gap.

4. The FPC cable of claim 3, wherein when the bending region is curved in a second direction opposite to the first direction, the ground reference layer segments are spaced from one another by a third gap smaller than the first gap.

5. The FPC cable of claim 2, wherein when the bending region is substantially coplanar, the ground reference layer segments are spaced from one another by a gap equal to or less than $1/50^{th}$ of a wavelength of a highest frequency signal carried by the plurality of signal lines.

6. The FPC cable of claim 2, wherein when the bending region is substantially coplanar, the ground reference layer segments are spaced from one another by a gap equal to or less than $1/100^{th}$ of a wavelength of a highest frequency signal carried by the plurality of signal lines.

7. The FPC cable of claim 2, wherein when the bending region is substantially coplanar, the ground reference layer segments are spaced from one another by a gap equal to or less than 12 mm.

8. The FPC cable of claim 2, wherein when the bending region is substantially coplanar, the ground reference layer segments are spaced from one another by a gap equal to or less than 3 mm.

9. The FPC cable of claim 1, wherein the ground reference layer comprises a first planar ground reference surface extending longitudinally from a first endmost ground reference layer segment of the plurality of ground reference layer segments, and a second planar ground reference surface extending longitudinally from a second endmost ground reference layer segment opposite to the first endmost ground reference layer segment of the plurality of ground reference layer segments.

10. The FPC cable of claim 1, wherein the first sub-segment is connected with a first via to the first ground trace and the second sub-segment is connected with a second via to the second ground trace.

11. The FPC cable of claim 10, wherein the FPC cable further comprises a third ground trace and a fourth ground trace on the first side of the insulator substrate, the first sub-segment is connected with a third via to the third ground trace, and the second sub-segment is connected with a fourth via to the fourth ground trace.

12. The FPC cable of claim 1, wherein the first sub-segment is substantially colinear with the second sub-segment.

13. The FPC cable of claim 1, wherein the insulator substrate is a first insulator substrate, the ground reference layer is a first ground reference layer, and the plurality of ground reference layer segments are a plurality of first ground reference layer segments, wherein the FPC cable further comprises a second insulator substrate between the first ground trace and a second ground reference layer, the second ground reference layer comprising a plurality of second ground reference layer segments spaced from one another, wherein each of the second ground reference layer segments is connected with a via to the first ground trace and the second ground trace.

14. The FPC cable of claim 13, wherein each of the second ground reference layer segments is also connected with the via to a corresponding first ground reference layer segment of the first ground reference layer.

15. The FPC cable of claim 13, wherein each of the first ground reference layer segments is located in between two opposing second ground reference layer segments in the longitudinal direction along a length of the FPC cable.

16. An electronic device, comprising:

a housing;

a first electronic component in the housing;

a second electronic component in the housing; and a flexible printed circuit (FPC) cable connecting the first electronic component and the second electronic component, the FPC cable comprising:

a first ground trace extending in a longitudinal direction on a first side of an insulator substrate;

a second ground trace extending in the longitudinal direction on the first side of the insulator substrate spaced from the first ground trace;

a plurality of signal lines between the first ground trace and the second ground trace; and a ground reference layer on a second side of the insulator substrate, the ground reference layer comprising a plurality of ground reference layer segments spaced from one another in the longitudinal direction, wherein each of the ground reference layer segments is connected with a via to the first ground trace and the second ground trace, wherein each of the ground reference layer segments comprises a first sub-segment and a second sub-segment spaced from the first sub-segment in a lateral direction and the longitudinal direction.

17. The electronic device of claim 16, wherein the plurality of ground reference layer segments substantially define a bending region of the FPC cable, wherein when the bending region is substantially coplanar, the ground reference layer segments are spaced from one another by a first gap, and when the bending region is curved, the ground reference layer segments are spaced from one another by a second gap greater than the first gap.

18. The electronic device of claim 17, wherein when the bending region is curved in a first direction, the ground reference layer segments are spaced from one another by the second gap greater than the first gap, and when the bending region is curved in a second direction opposite to the first direction, the ground reference layer segments are spaced from one another by a third gap smaller than the first gap.

19. The electronic device of claim 16, wherein the first sub-segment is connected with a first via to the first ground trace and the second sub-segment is connected with a second via to the second ground trace.

20. A method of manufacturing a flexible printed circuit (FPC) cable, the method comprising:

providing an FPC cable with a first ground trace extending in a longitudinal direction on a first side of an insulator substrate, a second ground trace extending in the longitudinal direction on the first side of the insulator substrate spaced from the first ground trace, and a plurality of signal lines between the first ground trace and the second ground trace; and creating a bending region in the FPC cable by:

providing a ground reference layer on a second side of the insulator substrate, wherein the ground reference layer comprises a plurality of ground reference layer segments spaced from one another in the longitudinal direction, wherein each of the ground reference layer segments comprises a first sub-segment and a second sub-segment spaced from the first sub-segment in a lateral direction and the longitudinal direction; and connecting each of the ground reference layer segments with a via to the first ground trace and the second ground trace.

* * * * *